US006760857B1

(12) United States Patent
Lau et al.

(10) Patent No.: US 6,760,857 B1
(45) Date of Patent: Jul. 6, 2004

(54) SYSTEM HAVING BOTH EXTERNALLY AND INTERNALLY GENERATED CLOCK SIGNALS BEING ASSERTED ON THE SAME CLOCK PIN IN NORMAL AND TEST MODES OF OPERATION RESPECTIVELY

(75) Inventors: Benedict C. Lau, San Jose, CA (US); Leung Yu, Los Altos, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 09/507,302

(22) Filed: Feb. 18, 2000

(51) Int. Cl.[7] .............................. G06F 1/04; G11C 29/00
(52) U.S. Cl. ....................... 713/500; 714/718; 714/720
(58) Field of Search ........................ 713/500; 714/718, 714/720, 733, 30, 738

(56) References Cited

U.S. PATENT DOCUMENTS

| 5,164,665 A | * | 11/1992 | Yamashita et al. ......... 324/73.1 |
| 5,202,626 A | * | 4/1993 | Pham et al. ............... 324/73.1 |
| 5,254,883 A | | 10/1993 | Horowitz et al. ........... 307/443 |
| 5,875,153 A | * | 2/1999 | Hii et al. .................... 365/201 |
| 6,047,346 A | * | 4/2000 | Lau et al. ................... 327/158 |
| 6,324,485 B1 | * | 11/2001 | Ellis ........................... 702/108 |

FOREIGN PATENT DOCUMENTS

JP            63120320 A   *   5/1988   ............. G06F/1/04

OTHER PUBLICATIONS

Hashihimoto et al, Clock–driven On–chip Testing for Superconductor Logic Circuits, Jun. 1999, IEEE.*
Ware, F.A., Rambus (8/98), "Advance Information: Direct RAC Data Sheet," 1–46. Last update Aug. 7, 1998.

* cited by examiner

Primary Examiner—Thomas Lee
Assistant Examiner—Suresh K Suryawanshi
(74) Attorney, Agent, or Firm—Morgan, Lewis & Bockius LLP

(57) ABSTRACT

A clock signal driven device has a clock pin for receiving an externally generated clock signal during normal operation. Internal circuitry coupled to the clock pin is responsive to the externally generated clock signal during normal operation. The device also has a clock source, such as a PLL, that provides an internal clock signal, and an internal clock generator that during a test mode of operation generates from the internal clock signal and asserts on the clock pin a test clock signal. The test clock signal has substantially similar signal characteristics to predefined signal characteristics of the externally generated clock signal. The device's internal circuitry is responsive to the test clock signal during the test mode of operation.

33 Claims, 8 Drawing Sheets

SYSTEM HAVING BOTH EXTERNALLY AND INTERNALLY GENERATED CLOCK SIGNALS BEING ASSERTED ON THE SAME CLOCK PIN IN NORMAL AND TEST MODES OF OPERATION RESPECTIVELY

The present invention relates to an apparatus for and a method of providing a clock signal for testing a device.

BACKGROUND OF THE INVENTION

Semiconductor memories are used to store information in computer systems. As processor speeds continue to increase, the capacity and data rate of memory devices also continues to increase. Typically the processor accesses data at a much higher data rate than the data rate of the memories. In a memory system, a memory controller provides an interface between the memories and the processor. The memory controller and memories are designed to operate in accordance with predefined specifications. During the manufacturing process, the memory controller and memories are tested to ensure that they operate in accordance with the specifications. For example, the memory controller has inputs or pins that transmit and receive external clock signals, control signals and data signals. To test the memory controller, the memory controller is placed in a socket at a test station and the external clock signal and data signals are supplied, varied, and the performance of the memory controller is measured. As data rates increase, the frequency of the external clock signal increases. Supplying an external high speed clock requires an expensive high speed tester. Memory controllers are becoming increasingly sophisticated and may provide an internal high speed clock signal. Therefore, to reduce cost and simplify testing, an apparatus and method that uses the internal high speed clock for testing the memory controller is needed.

SUMMARY OF THE INVENTION

In summary, the present invention provides a clock signal driven device that has a clock pin for receiving an externally generated clock signal during a normal mode of operation. Internal circuitry coupled to the clock pin is responsive to the externally generated clock signal during the normal mode of operation. The device also has a clock source, such as a PLL, that provides an internal clock signal, and an internal clock generator that during a test mode of operation generates from the internal clock signal and asserts on the clock pin a test clock signal. The test clock signal has substantially similar signal characteristics to predefined signal characteristics of the externally generated clock signal. The device's internal circuitry is responsive to the test clock signal during the test mode of operation.

In a preferred embodiment, the device has two clock pins that receive externally generated differential clock signals, and the internal clock generator generates a pair of differential test clock signals that are asserted on the two clock pins. A set of clock current control bits are stored in a register. The internal clock generator includes a plurality of clock output drivers for generating each test clock signal, with each of the clock output drivers being selectively enabled by a corresponding one of the clock current control bits. Each clock output driver preferably includes a slew rate controlled predrive circuit that generates an intermediate clock signal having a slew rate in accordance with a set of slew rate control bits stored in a slew rate control register.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENTS

Figure 1:
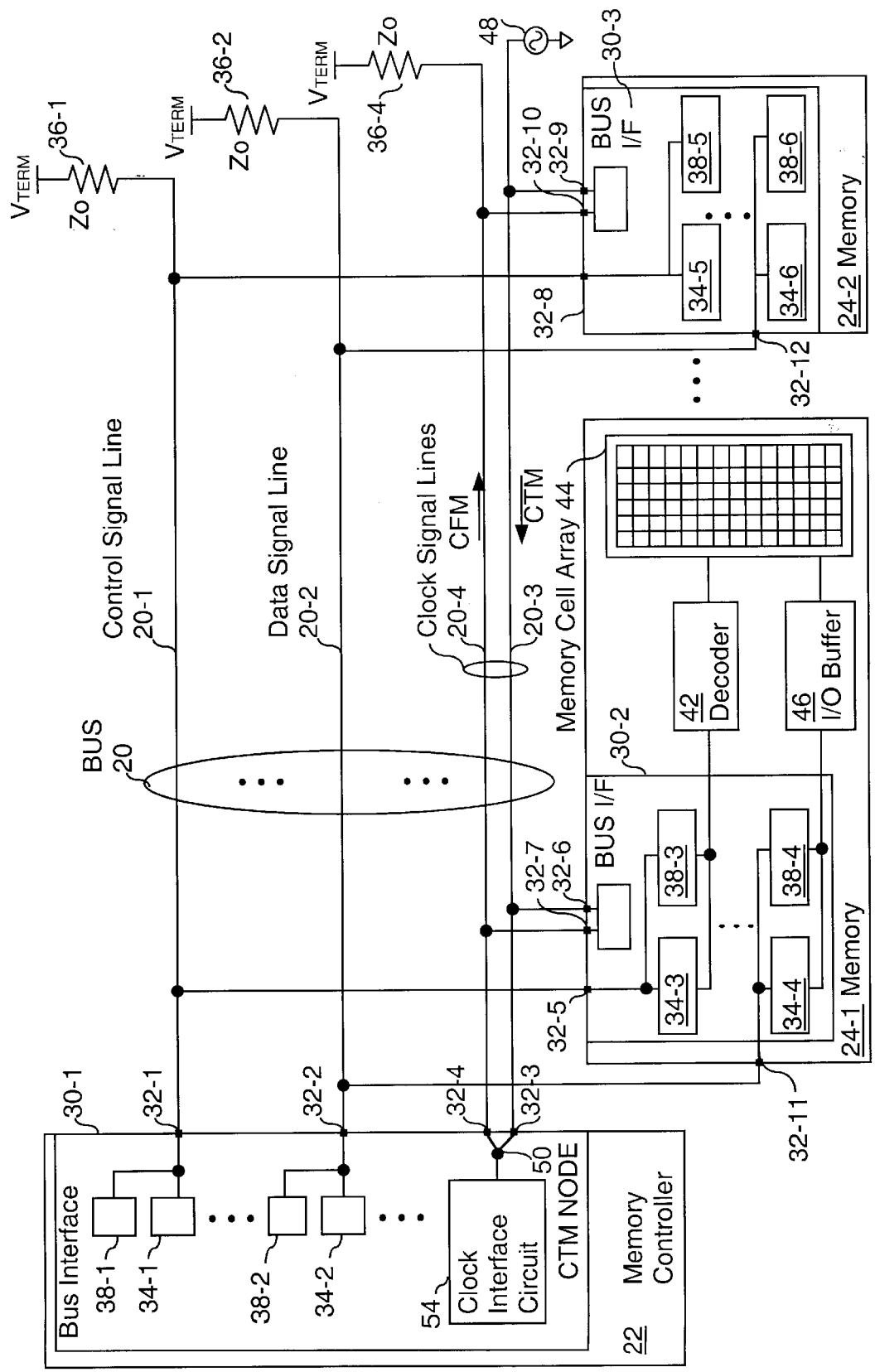
FIG. 1 is block diagram a memory system including a memory controller and memories during normal operation, the memory controller and memories having a clock interface circuit that generates an internal clock signal during testing in accordance with an embodiment of the present invention.

In FIG. 1, the overall architecture of a bus 20 using a single-ended clock signal is shown. The bus 20 interconnects a memory controller 22 and memories 24. In the memory controller 22 and memories 24, a bus interface (Bus I/F) 30 provides the connections to and signaling with the bus 20. The bus 20 is formed of signal lines 20-1, 20-2, 20-3 and 20-4 that transmit control, data and clock signals. Physically, on each device 22, 24, the control, data and clock signals are supplied to and output from external connections, called pins 32, and the signal lines 20 interconnect respective pins 32 on different devices. Each device 22, 24 has bus output driver circuits 34 that connect to the pins 32 to transmit signals to other devices attached to the bus 20. In a device, each bus output driver circuit 34 drives a single signal line of the bus 20. For example, bus output driver 34-1 in the memory controller 22 drives signal line 20-1. The device may be implemented using one set of signals, such as CMOS signals, while the bus may be implemented using bus signals different from the CMOS signals. In one implementation, the CMOS signals use a first set of voltage levels to represent information, while the bus uses a second set of voltage levels. The first set of voltage levels is different from the second set of voltage levels. The first and second sets of voltage levels may have different voltage swings. Alternately, the first and second sets of voltage levels may also use different numbers of predefined voltage levels to encode information. Although multiple bus output drivers 34 are attached to a single signal line, logic in the bus interface 30 synchronizes the transmission of data among the devices on the bus so that the devices transmit data at times such that the receivers will properly decode the data. The bus 20 supports signaling with characteristics that are a function of many factors such as the system clock speed, the bus length, the amount of current that the output driver circuits can drive, the supply voltages, the spacing and width of the wires or traces making up the bus 20, the physical layout of the bus 20 itself and the resistance of a terminating resistor $Z_0$ 36 that may be attached to some of the signal lines of the bus 20.

The bus 20 uses current mode signaling. The output driver circuits 34 are designed to drive the bus 20 with a predetermined amount of current; and the bus receivers 38 are designed to receive the signals sent by the output driver circuits 34 on the bus 20. The amount of current used to drive the bus is determined, at least in part, by the output driver circuits 34 and terminating resistors $Z_0$ 36.

A subset of the signal lines 20 connect to terminating resistors $Z_0$ 36 which connect to a termination voltage $V_{TERM}$. In one embodiment, the resistance of the terminating resistors $Z_0$ 36 is equal to twenty-eight ohms. The termination voltage $V_{TERM}$ can be different from the supply voltage $V_{DD}$. For instance, the supply voltage $V_{DD}$ may be equal to 2.5 volts while the termination voltage $V_{TERM}$ is equal to 1.8 volts. With respect to the bus signals, the termination voltage $V_{TERM}$ represents a logical zero. When driving the logical zero, the output driver circuit 34 does not drive current on its respective signal line 20. The bus voltage for a signal at a low level $V_{OL}$, which represents a logical one, is equal to approximately 1 volt. When driving the logical one, the output driver circuit 34 drives approximately 36 milliamps on the signal line 20. The voltage swing of the signal line is 0.8 volts. In an alternate embodiment, the bus voltage for a signal at the low voltage level represents a logical zero, while the bus termination voltage $V_{TERM}$ represents a logical one.

In one embodiment, the memories 24 are random access memories (RAMs). In an alternate embodiment, the memories 24 are read-only memories (ROMs). Alternately, the bus interface 30 is implemented in other semiconductor devices that use a bus 20 to interconnect various types of integrated circuits such as microprocessors and disk controllers.

In the exemplary memory system of FIG. 1, the memory controller 22 supplies an address to the memory 24-1 using the control signal line 20-1 to transmit one bit of the address. For simplicity, the other control signal lines are not shown. In the memory 24-1, a bus receiver 38-3 receives the address bit and passes the received address to a decoder 42. To receive the entire address, the decoder 42 receives address bits from multiple bus receivers. For simplicity, only one bus receiver 38-3 is shown. The decoder 42 generates the signals to access the data stored at a particular row and column of a memory cell array 44. To read data from the memory 24, in response to the decoder 42 and other control signals from the bus 20, the memory cell array 44 supplies data from the desired address to an input/output (I/O) buffer 46 which supplies the data to the bus 20-2 via the output driver 34-4. To write data to the memory, the memory controller 22 supplies an address as described above. The memory controller 22 also supplies data signals via the output driver circuits 34 to the bus 20. The memory 24-1 receives the address as described above, and also receives the data signals via the receiver 38-4 and passes the data to the memory cell array 44 for storage via the I/O buffer 46.

A single-ended clock signal synchronizes the bidirectional transmission of data on the bus 20. When memory devices 24 transmit data towards the memory controller 22, a clock-to-master (CTM) signal synchronizes the data transmission. A clock generator 48 supplies the CTM signal on clock signal line 20-3. The master device 22 supplies the clock-from-master signal on clock signal line 20-4 which is terminated by resistor 36-4. On each device 22, 24, a CTM pin 32-3, 32-7, 32-9 receives the CTM signal. In the bus interface 30, a clock interface circuit 54 receives the CTM signal from the CTM pin 32-3 at the CTM node 50.

When the memory controller 22 transmits data and/or control signals to a memory device 24, the clock-from-master (CFM) signal synchronizes the transmission on the bus 20. The bus interface 30 of the memory controller 22 provides the CFM signal to clock signal line 20-4 via CFM pin 32-4. In the bus interface 30, the CTM node 50 is connected to the CFM pin 32-4. In this way, the CTM signal becomes the CFM signal. The CFM signal is transmitted via the CFM pin 32-4 on signal line 20-4 which is terminated by resistor 36-4. On each device 24, a CFM pin 32-7 and 32-10 receives the CFM signal from the memory controller 22.

Figure 2:
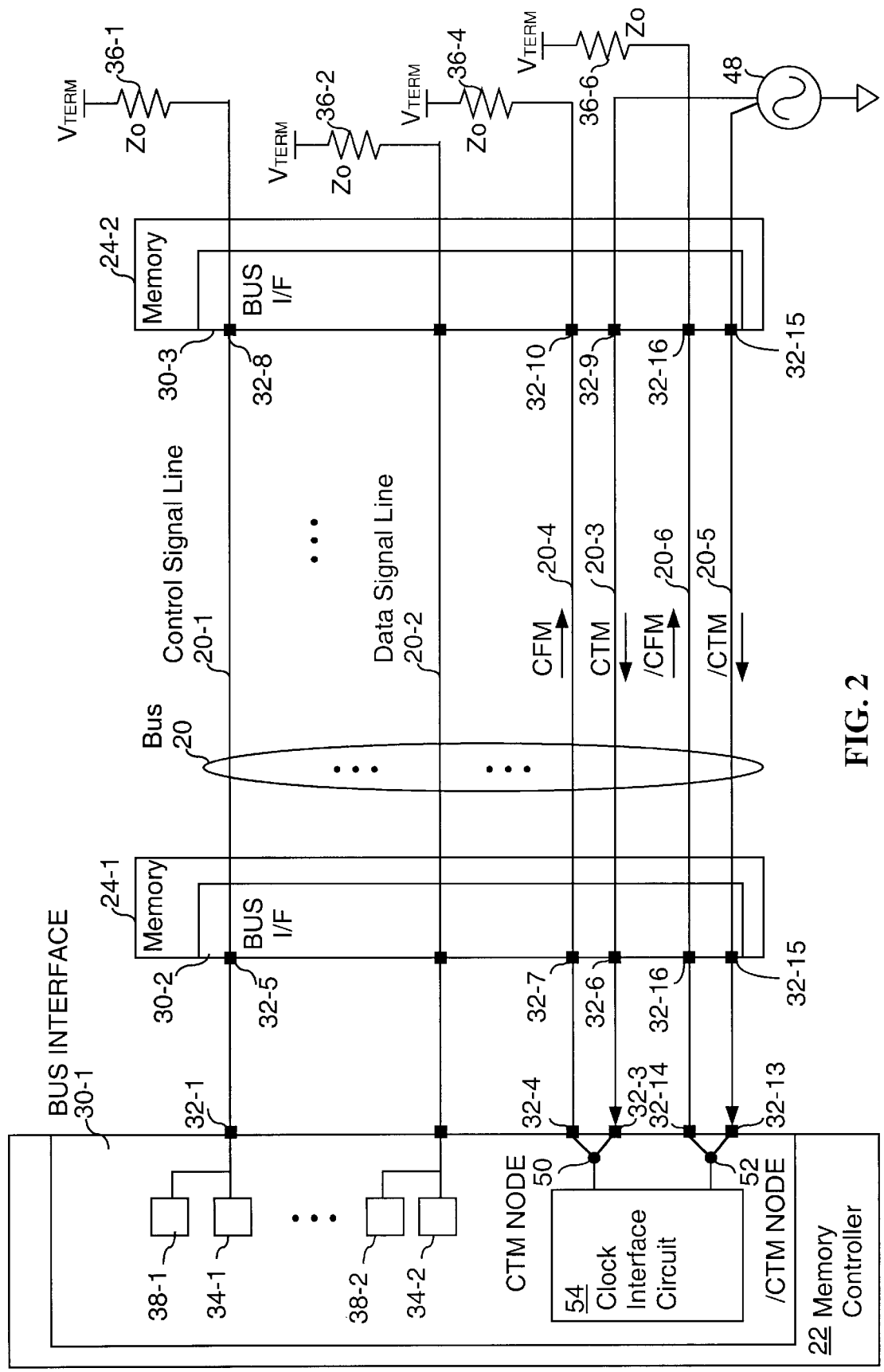
FIG. 2 is a block diagram of an alternate embodiment the memory system of FIG. 1 that uses differential clock signaling including a clock-to-master (CTM) signal and a complementary clock-to-master (/CTM) signal.

FIG. 2 is an alternate embodiment of the bus system of FIG. 1 that uses differential clock signals. Complementary CTM and CFM signals, /CTM and /CFM, respectively, are used in addition to the CTM and CFM signals. The bus interface 30 of each memory device 24 overlays the bus signal lines 20. The clock generator 48 supplies the /CTM signal on signal line 20-5 which is received at the /CTM pin 32-15 on each device 24 and at the /CTM pin 32-13 of the memory controller 22. A /CTM node 52 connects the /CTM pin 32-13 to a /CFM pin 32-14 and the /CTM signal becomes the /CFM signal. The /CTM signal is received at a /CFM pin 32-16 on each device 24.

Figure 3:
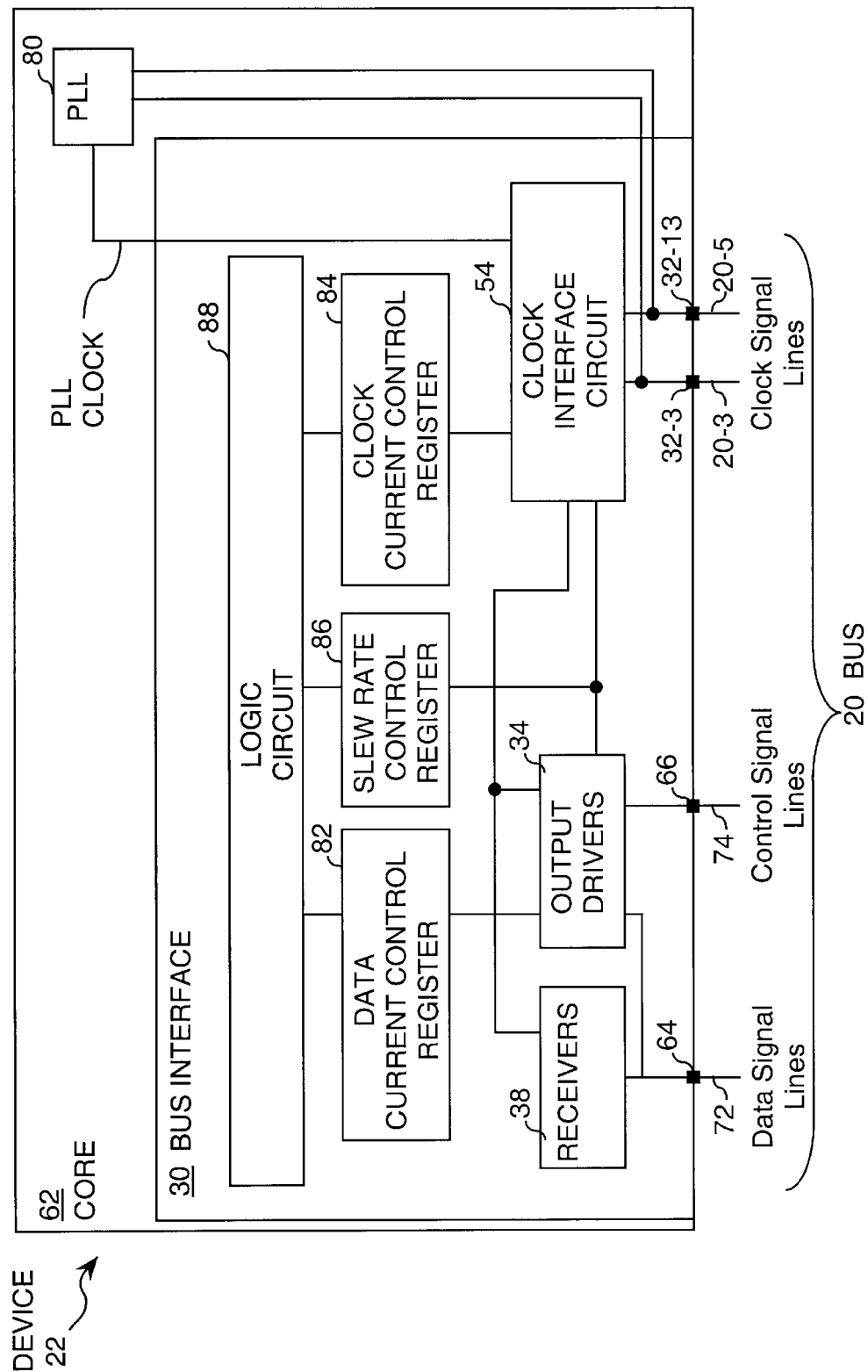
FIG. 3 is a block diagram of an exemplary device that generates an internal CTM clock signal in accordance with an embodiment of the present invention.

As shown in FIG. 3, the exemplary memory controller 22 has the bus interface 30 and a core 62. In one implementation, the bus interface 30 is a library macrocell that is used in application specific integrated circuit (ASIC) designs to interface the core of a CMOS ASIC device to a high-speed bus 20. The CMOS ASIC device may be the memory controller 22 (FIG. 1), the memory device 24 (FIG. 1) or other integrated circuit.

The core 62 is the portion of a device that implements a specified function. In this example, the core 62 includes memory controller logic. In another example, referring back to FIG. 1, in a memory 24, the core 62 includes the decoder 42, memory array 44 and I/O buffer 46.

In FIG. 3, the bus interface 30 provides the circuitry and signaling to allow the core 62 to communicate with other devices on the bus 20. One function of the bus interface 30 is to provide an interface between a slow, wide internal CMOS bus to the hi-speed narrow device bus 20. The data, control and clock pins, 64, 66, 32-3 and 32-13, connect to the control, data and clock signal lines, 72, 74, 20-3 and 20-5, respectively, of the bus 20. For simplicity, a single data signal line 72, control signal line 74, data pin 64 and control pin 68 are shown. As described above, each data pin 64 connects to a receiver 38 and to an output driver 34. Other output drivers 34 transmit the control signals onto the control signal lines 74 via control pins 66.

During normal operation, the external clock signals, the CTM and /CTM signals, are supplied to the CTM and /CTM clock input pins, 32-3 and 32-13, by an external clock source via the CTM and /CTM clock signal lines, 20-3 and 20-13, respectively.

During testing, the device 22 internally generates the CTM and /CTM signals, rather than receiving the CTM and /CTM signals from an external source. In the core 62, a phase-locked loop (PLL) 80 supplies an internal PLL clock signal to the clock interface circuit 54. The internal PLL clock signal has a frequency approximately equal to 400 MHz, and uses CMOS voltage levels rather than the voltage levels of the bus 20. The clock interface circuit 54 generates internal CTM and /CTM signals from the internal PLL clock signal. The internal CTM and /CTM signals have substantially the same high voltage level, low voltage level, slew rate and frequency as the externally supplied clock signals. In particular, like the external CTM and /CTM clock signals, the internal CTM and /CTM clock signals have a frequency approximately equal to 400 MHz, a high voltage of about 1.8 volts and a low voltage of approximately 1 volt.

The clock interface circuit 54 receives the CTM and /CTM signals from the CTM and /CTM nodes, respectively, and generates a ~0° clock signal and a ~90° clock signal, and a ~/0° clock signal and a ~/90° clock signal from the CTM and /CTM signals, respectively, to synchronize the transmission of data over the bus 20. The specified number of degrees, such as 0°, in the signal name describes the approximate phase shift of that signal with respect to the CTM and /CTM clock signals at nodes 50 and 52, whether supplied externally or generated internally. The tilde (~) indicates that the respective clock signal includes an offset with respect to the actual transmission time of the data over the bus 20 at pins 64.

A data current control register 82 sets the amount of drive current that the data output drivers 34 use to drive an outgoing data signal onto a data signal line of the bus. A clock current control register 84 connects to the clock interface circuit 54 to set the amount of drive current to drive the internal clock signals during testing. The clock interface circuit 54 will be further described with reference to FIG. 6.

A slew rate control (SRC) register 86 supplies slew rate control bits to the output drivers 34 to set the slew rate of the data and control signals. The SRC register 86 also supplies the slew rate control bits to the clock interface circuit 54 to set the slew rate of the internal CTM and /CTM clock signals.

A logic circuit 88 connects to the data current control register 82, clock current control register 84 and slew rate control register 86. The logic circuit 88 determines operational values for the data current control bits, the clock current control bits and slew rate control bits in the data current control register 82, the clock current control register 84 and the slew rate control register 86, respectively.

Figure 4:
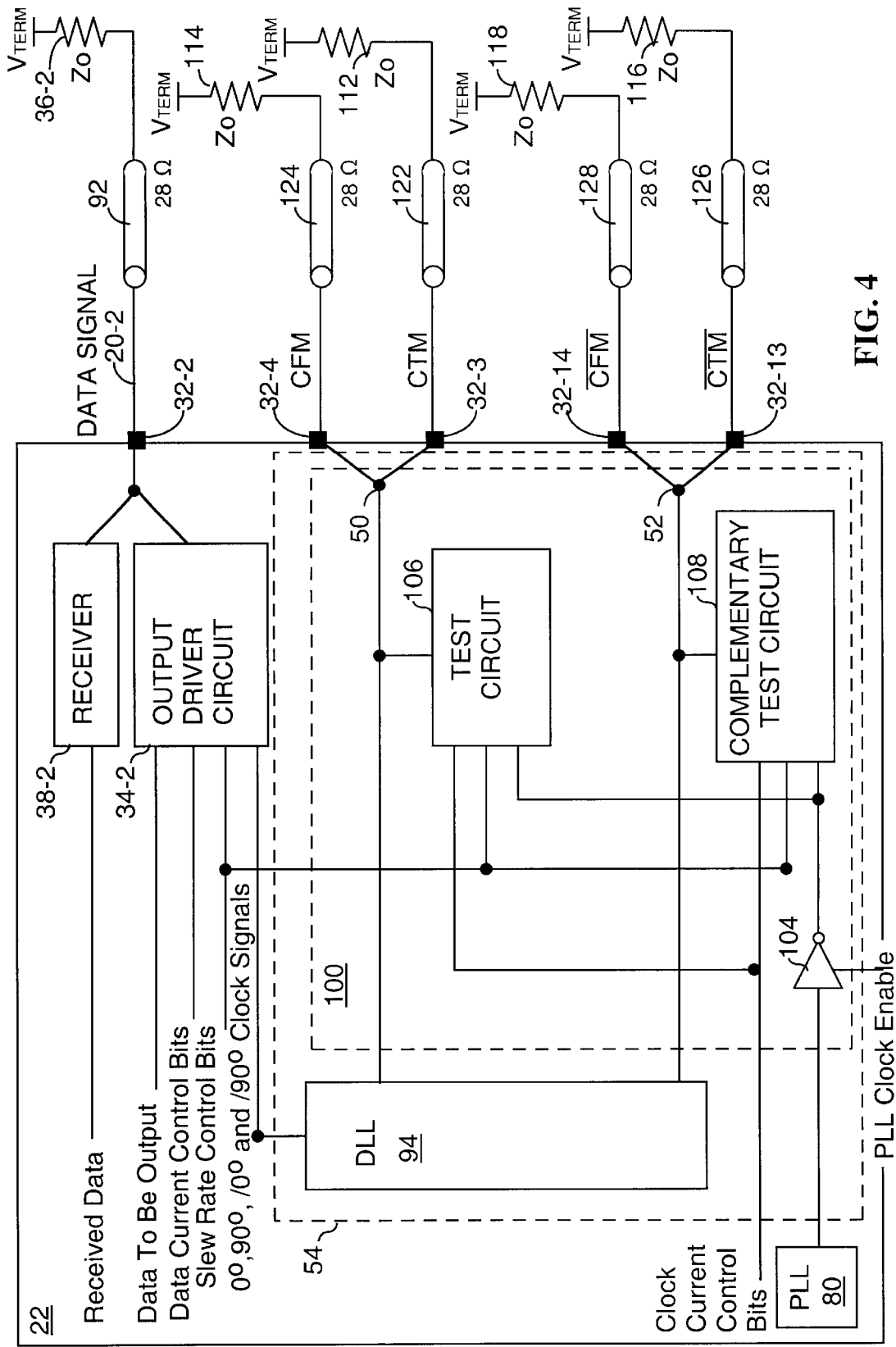
FIG. 4 is a block diagram of the memory controller in a test environment which emulates the memory systems of FIGS. 1 and 2 during normal operation.

In FIG. 4, the overall architecture of the clock interface circuit 54 of the bus interface in the memory controller 22 in accordance with an embodiment of the present invention is shown. The data receiver 38-2 receives the data signal from the data pin 32-2 and the ~0° clock signal, and outputs a received data signal. The data signal at pin 32-2 is received in accordance with an ideal 0° clock signal, the CTM signal. The ~0° clock signal is offset with respect to the actual appearance of the data signal at data pin 32-2 by the set-up time of the receiver. Similarly, other data receivers receive data in accordance with the ~/0° clock signal which is offset with respect to the actual appearance of the data signal at the data pins by the set-up time of the receivers. In other words, the ~/0° clock signal is offset with respect the /CTM signal.

The data output drive circuit 34-2 drives data to be output onto the data signal line 20-2 in accordance with the ~90° clock signal, data current control register and slew rate control register of FIG. 3. The ~90° clock signal includes an offset with respect to the ideal data transmission time at data pin 32-2. The offset is substantially equal to a delay of a predriver circuit in the output drive circuit 34-2. Because of the offset, the output driver circuit 34-2 transmits data at pin 32-2 at the ideal data transmission time, that is, synchronized to the CFM clock. Similarly, other data output drive circuits drive data onto the data signal line in accordance with the complementary ~/90° clock signal. The ~/90° clock signal also includes the offset of the predriver, and transmits data at pin 32-2 at the ideal complementary data transmission time, that is, synchronized to the /CFM clock.

During testing, termination resistor 36-2 connects the data pin 32-2 to the termination voltage $V_{TERM}$. The resistor 36-2 has an impedance $Z_0$ substantially equal to 28 ohms. The cylinder 92 on the data signal line 20-2 represents the impedance of the data signal line 20-2 which is substantially equal to the impedance of the termination resistor 36-2, that is, 28 ohms.

The clock interface circuit 54 includes a delay-locked loop (DLL) 94 that receives the CTM and /CTM signals from the CTM and /CTM nodes, 50 and 52, respectively. The DLL 94 generates the ~0° clock signal and the ~90° clock signal from the incoming CTM signal at the CTM node 50. The DLL 94 generates the ~90° clock signal by delaying the incoming CTM signal from the CTM node 50. The ~0° clock signal and the ~90° clock signal are supplied to at least a subset of the output drivers 34 and receivers 38 to synchronize the timing of data transmission between the device 22 and the bus 20. Similar to the ~0° and ~90° clock signals, the DLL 94 also generates the complementary ~/0° and ~/90° clock signals from the /CTM signal at the /CTM node 52. The DLL 94 supplies the ~/0° and ~/90° clock signals to at least a subset of the data output drivers 34 and receivers to synchronize the timing of data transmission between the device 22 and the bus 20.

When the device 22 is tested, a test clock generator 100 in the clock interface circuit 54 generates and provides the internal CTM and /CTM clock signals at the CTM and /CTM nodes, 50 and 52, rather than receiving the external CTM and /CTM clock signals, respectively.

The PLL 80 supplies the internal PLL clock signal to tri-state inverter 104. During testing, a PLL clock enable signal from a control register in the bus interface activates the tri-state inverter 104. When active, the tri-state inverter 104 supplies the internal PLL clock signal to a test circuit 106 and a complementary test circuit 108 in the test-clock generator 100. The test circuit 106 provides the internal CTM clock signal to the CTM node 50. The complementary test circuit 108 provides the complementary internal /CTM clock signal to the /CTM node 52.

For testing, the device 22 is placed in a test socket at a testing station. Unlike in normal operation, in test operation, to prevent undesirable reflections while using the internal clock signals, the CTM, CFM, /CTM and /CFM pins, 32-3, 32-4, 32-13 and 32-14, are pulled up to the termination voltage $V_{TERM}$ via 28 ohm termination resistors, 112, 114, 116 and 118, respectively.

Figure 5:
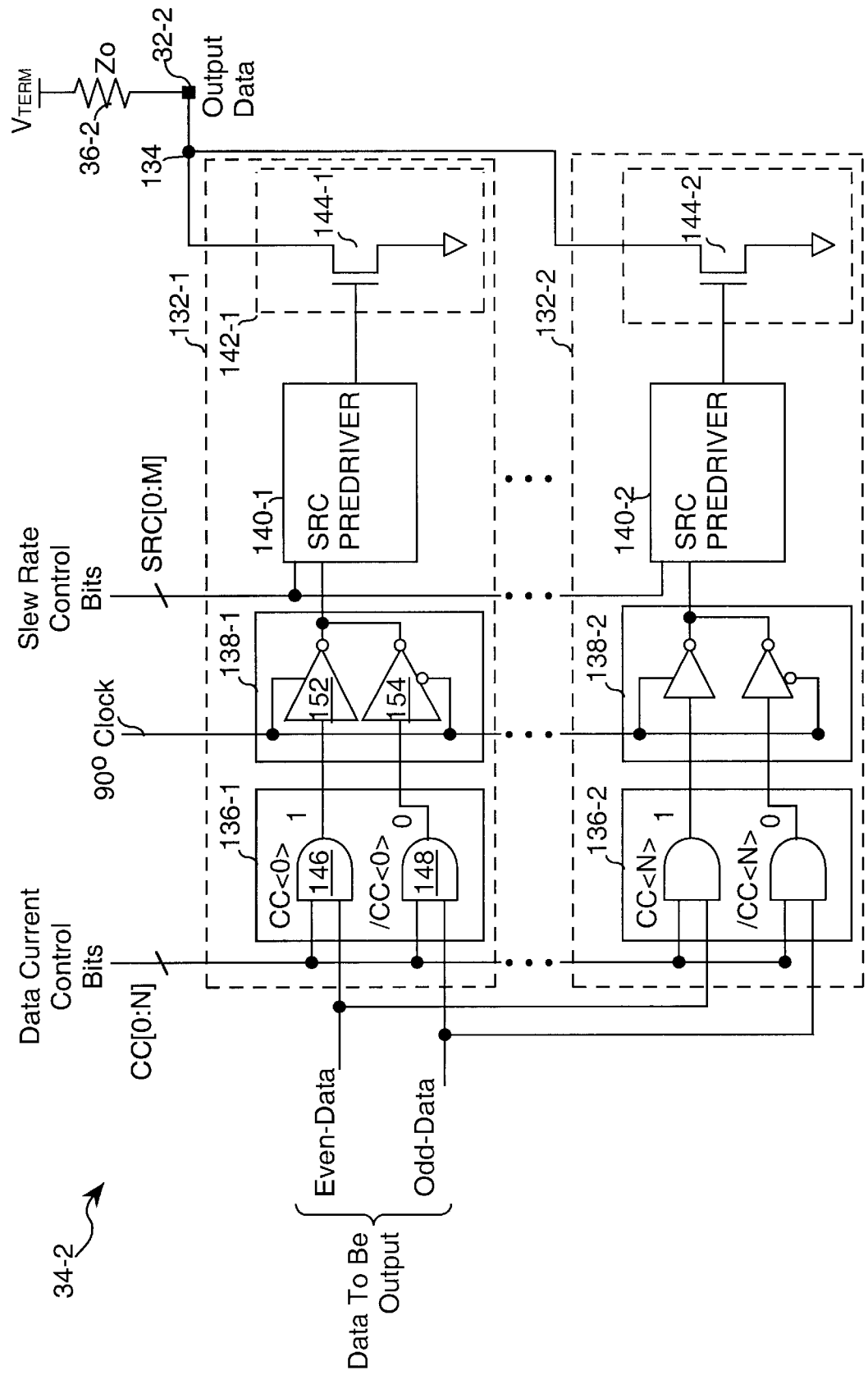
FIG. 5 is a circuit diagram of an exemplary data output driver of FIG. 4.

FIG. 5 is a circuit diagram of an exemplary data output driver 34-2 of FIG. 4 that alternately outputs even and odd data on opposite phases of the ~90° clock signal. Because the data and control output drivers are the same, the description of data output driver 34-2 also applies to the control output drivers 34-1. The data output driver 34-2 connects to data pin 32-2 which is pulled-up to the termination voltage by the termination resistor 36-2 which has an impedance of 28 ohms. The data output driver 34-2 has one or more current-control-data-output circuits 132 that are connected together at data node 134. Each current-control-data-output circuit 132 drives the data node 134 with a predetermined amount of drive current in response to a distinct current control bit. Current control data output circuit 132-1 is responsive to current control bit 0, and current control data output circuit 132-2 is responsive to current control bit N.

Each current-control-data-output circuit 132 has a data input circuit 136, a even-odd multiplexing circuit 138, a slew-rate-controlled (SRC) predriver 140, and an output-data-drive block 142. The output-data-drive block 142 has an NMOS drive transistor 144 that sinks a predetermined amount of current from the data node 134 to ground in response to an intermediate data signal provided by the SRC predriver 140 to its gate. The amount of current that the NMOS drive transistor 144 sinks is determined by its width and length. The NMOS drive transistors 144 of the current-control-data-output circuits 132 are binary weighted with respect to each other. For example, the NMOS drive transistor 144-1 of the current-control-data-output circuit 132-1 associated with current control bit 0 (CC<0>) is sized to sink an amount of drive current equal to $I_0$, while the NMOS drive transistor 144-2 of the current-control-data-output circuit associated with current control bit 1 (CC<1>) is sized to sink an amount of drive current equal to one-half of $I_0$. More generally, where i represents the particular current control bit associated with a current-control-data-output circuit 132, the corresponding NMOS drive transistor 144 of the current-control-data-output circuit 132 associated with current control bit i (CC<i>) is sized to sink an amount of drive current $I_i$ in accordance with relationship (1) as follows:

$$I_i = \frac{1}{2^i} I_0. \quad (1)$$

In sum, all of the current-control-data-output circuits 132 are the same, except for receiving a distinct current control bit and having an NMOS drive transistor 144 with a distinct binary weighting.

The data input circuit 136 receives data bits to be output as even and odd data. The even data bit is output on the rising edge of the ~90° clock signal, and the odd data bit is output on the falling edge of the ~90° clock signal. The data input circuit 136 also receives one of the current control bits that determines whether a respective current-control-data output circuit 132 will drive the data node 134. In the data input circuit 136, a first AND gate 146 receives the even-data and a second AND gate 148 receives the odd data. Both the first and second AND gates, 146 and 148, respectively, receive the current control bit. When the current control bit is a digital one, the first and second AND gates, 146 and 148, allow the even-data and the odd-data to be output, respectively. For example, when current control bit 0 (cc<0>) is a digital one and the even-data is a digital one, the first AND gate 146 outputs a digital one. When current control bit 0 (cc<0>) is a digital zero, the first and second AND gates, 146 and 148, respectively, output a digital zero, regardless of the state of the even and odd data, and that current-control-data-output circuit 132-1 does not drive current from the data node 134.

In the even-odd-multiplexing circuit 138, first and second tri-state inverters, 152 and 154, receive the even and odd data signals from the first and second AND gates, 146 and 148, respectively. The outputs of the first and second tri-state inverters, 152 and 154, respectively, are connected together. The ~90° clock signal is supplied to complementary enable inputs on the first and second tri-state inverters, 152 and 154, to alternately output the even and odd data signals, respectively, during alternate phases of the ~90° clock signal as a multiplexed-data signal. The multiplexed-data signal is supplied to the slew-rate-controlled predriver 140, and subsequently to the output-data-drive block 142. The slew-rate-controlled predriver 140 will be further described with respect to FIG. 7.

Figure 6:
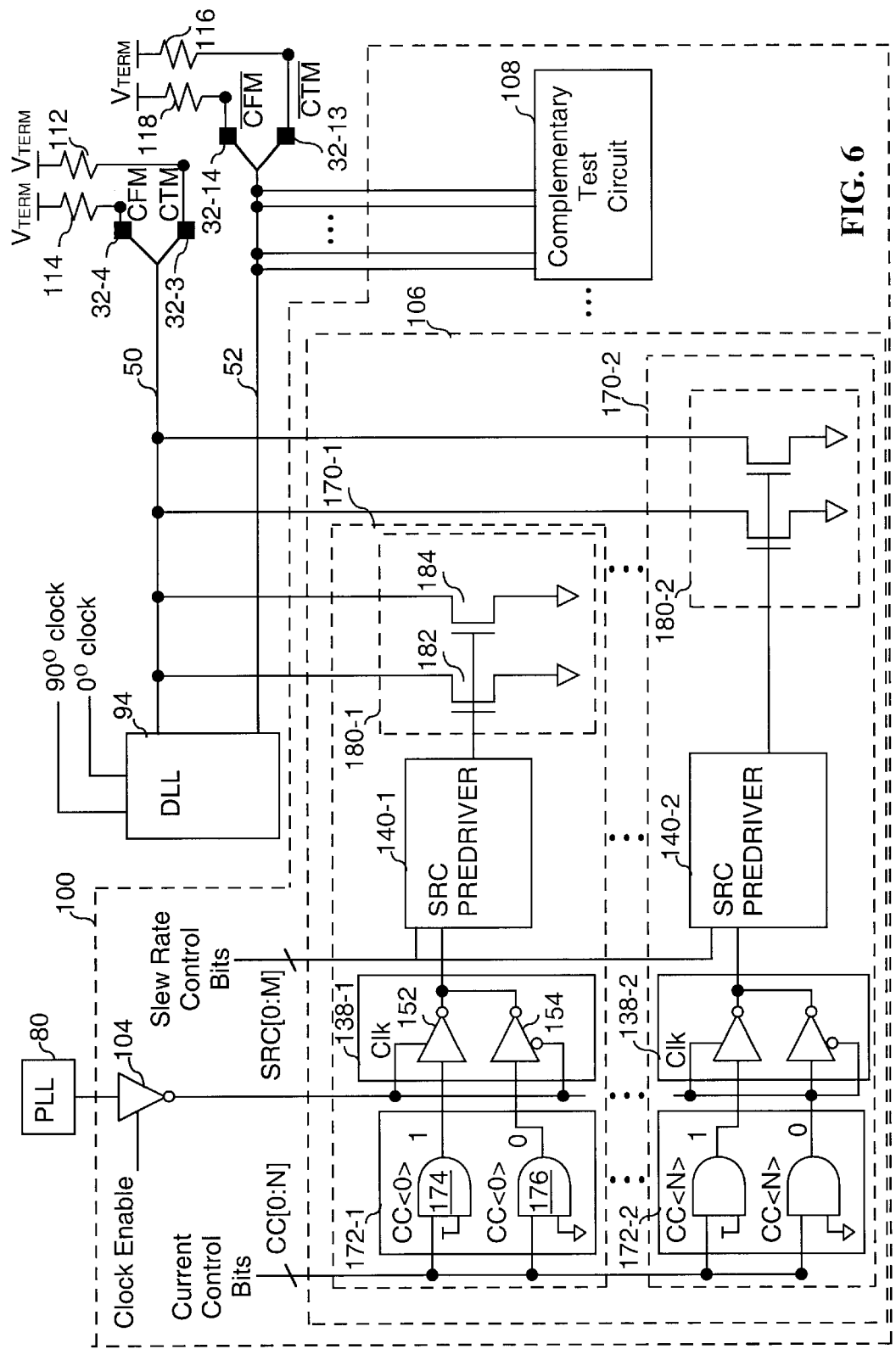
FIG. 6 is a circuit diagram of the internal CTM clock generator of FIG. 4.

FIG. 6 includes a more detailed circuit diagram of the test clock generator 100 of FIG. 4. The test clock generator 100 provides internal CTM and /CTM clock signals with substantially the same characteristics as the external CTM and /CTM clock signals that are provided during normal operation, thereby eliminating the need for an external clock generator. The internal CTM and /CTM clock signals have substantially the same frequency, duty cycle, slew rate, low output voltage, high output voltage, and voltage range as the external clock signals. Because the present invention supplies the internal CTM and /CTM clock signals to the CTM and /CTM nodes, 50 and 52, respectively, probes can be attached to the CTM, CFM, /CTM and /CFM output pins, 32-3, 32-4, 32-13, and 32-14, respectively, to monitor the re signals which provides additional testing capability.

For example, the DLL 94 supplies the ~90° clock signal to the output driver circuit 34-1 (FIG. 4). During testing, the ~90° clock signal is derived from the internal CTM clock signal at node 50, and has a ~90° phase shift with respect to the internal CTM clock signal. In other words, the ~90° clock signal includes the offset for the predriver with respect to the internal CTM clock signal. Therefore, the output data will be shifted 90° with respect to the internal CTM clock signal. If the device 22 fails a test, to further identify the cause of the failure, probes can be attached to the data pin 32-1, the CTM pin 32-3 and /CTM pin 32-13 to display the signals on a display and examine the relationship between their timing.

Because the CTM, CFM, /CTM and /CFM pins, 32-3, 32-4, 32-5 and 32-6, respectively, are connected during testing to terminating resistors 112, 114, 116 and 118 having the same resistance as the terminating resistors in normal operation, twice as much drive current is needed to drive the CTM and /CTM nodes, 50 and 52, respectively, during testing as compared to normal operation. The amount of drive current to drive the data and clock signals to the same low output voltage also depends on process, temperature and internal device characteristics. To more precisely adjust the drive current to provide an internal clock signal with substantially the same characteristics as the external clock signal, the test circuit uses one or more current-controlled-clock output circuits 170 that are similar to the current-controlled-data output circuits 132 of FIG. 5.

The current-controlled-clock output circuits 170 are connected to the CTM node 50. Each current-controlled-clock output circuit 170 drives a predetermined amount of current from the CTM node 50 in response to a respective a distinct clock current control bit from the clock current control register 84 (FIG. 3). In the test circuit 106, the number of clock current control bits and the number of current-controlled-clock output circuits 170 is preferably the same as the number of data current control bits and current-control-data-output circuits 132, respectively, of the data output driver 32-1 (FIG. 5).

In the data input block 172 of the current-controlled-clock output circuit 170, the data input is fixed. The input of the AND gate 174 is connected to the supply voltage to fix the even data signal to a digital one rather than receiving an even data signal. The input to the AND gate 176 is connected to ground to fix the odd data signal to a digital zero, rather than receiving an odd data signal. Because the data input to the second AND gate 174 is a digital zero, that is, one input to the second AND gate 174 is connected to ground, the second AND gate 174 always outputs a digital zero, regardless of the state of the current control bit for that AND gate 174. When the current control bit associated with the data input block becomes active, the first AND gate 172 outputs a digital one.

The even-odd-multiplexing circuit 138 and the slew-rate-controlled predriver 140 are the same as the even-odd-multiplexing circuit 138 of the data output circuit 34-1. When the internal PLL clock enable signal is active and the PLL clock buffer 104 is enabled, the internal PLL clock signal alternately enables and disables the respective tri-state inverters of the even-odd-multiplexing circuit to alternately output a "1" and a "0".

The slew-rate-controlled predriver 140 is the same as the slew-rate-controlled predriver 140 of the data output driver. The slew-rate-controlled predriver 140 receives the output of the inverters 152, 154, and the same slew rate control bits as the slew-rate-controlled predriver 140 of the data output driver. The slew rate control register 86 (FIG. 3) sets the slew rate of the transitions of the internal CTM clock signal. The slew-rate-controlled predriver 140 outputs an adjusted clock signal.

In the output drive block 180, the adjusted clock signal alternately activates and deactivates the NMOS drive transistors 182, 184 to generate the internal CTM clock signal at node 50. Since the internal PLL clock signal has a fifty percent duty cycle and the even input data is fixed to a digital one and the odd input data is fixed to a digital zero, the internal clock signal has a fifty percent duty cycle.

Because the CTM and CFM pins are both pulled up to 28 ohms, the combined impedance at the CTM node 50 is 14 ohms rather than 28 ohms and twice as much drive current is needed to drive the CTM node 50. Similarly, twice as much drive current is needed to drive the /CTM node 52. Because twice as much drive current is needed to drive the CTM and /CTM nodes, each current-controlled-clock output circuits 170 sinks twice as much current as its respective current-controlled-data output circuits 132 counterpart. In addition, because the CTM and CFM pins, 32-3 and 32-4, are both connected to the termination voltage $V_{TERM}$ via terminating resistors 112 and 114, respectively, during testing, for the internal CTM clock signal to have the same low output voltage, high output voltage, voltage swing, and slew rate as the external clock signal, the output-clock-drive blocks 180 of the test circuit 106 have two output drive transistors 182, 184, rather than the one output drive transistor 144 of the data output driver 34-1 (FIG. 5). Each drive transistor 182, 184 has the same geometry (and thus the same operating characteristics) as its respective drive transistor 144 of its counterpart current-controlled-data output circuit 132.

Similar to the output-data-drive blocks 132 (FIG. 5), the output-clock-drive blocks 170 of the test circuit 106 have binary-weighted NMOS transistors 182 and 184. In particular, each NMOS transistor 182, 184 of an output-clock-drive block circuit 170 has the same geometry as the NMOS transistor output-data drive block 132 that receives the corresponding data current control bit. Therefore, the drive transistors of the output-clock-drive blocks 170 closely match and have the same process variation as the drive transistors of the output-data-drive blocks.

In an alternate embodiment, a single NMOS drive transistor is provided in the output drive block of the adjustment circuit rather than two NMOS drive transistors. The single NMOS drive transistor is sized to sink the same amount of current as the two NMOS drive transistors. Because the single NMOS drive transistor does not have the same geometry as the drive transistors of the data output drivers, the single NMOS drive transistor has different operating characteristics with respect to process variation and the internal clock signal may not provide the same low output voltage, voltage range and slew rate as the dual NMOS driver transistor embodiment.

The complementary internal clock signals, /CTM and /CFM, are provided via the /CTM and /CFM pins, which are connected together at the /CTM node 52. The /CTM node 52 is connected to a complementary-test circuit 108. The complementary-test circuit is the same as the test circuit 106 that was described above, except that in the data input block the "1" and "0" are supplied to opposite AND gates.

Figure 7:
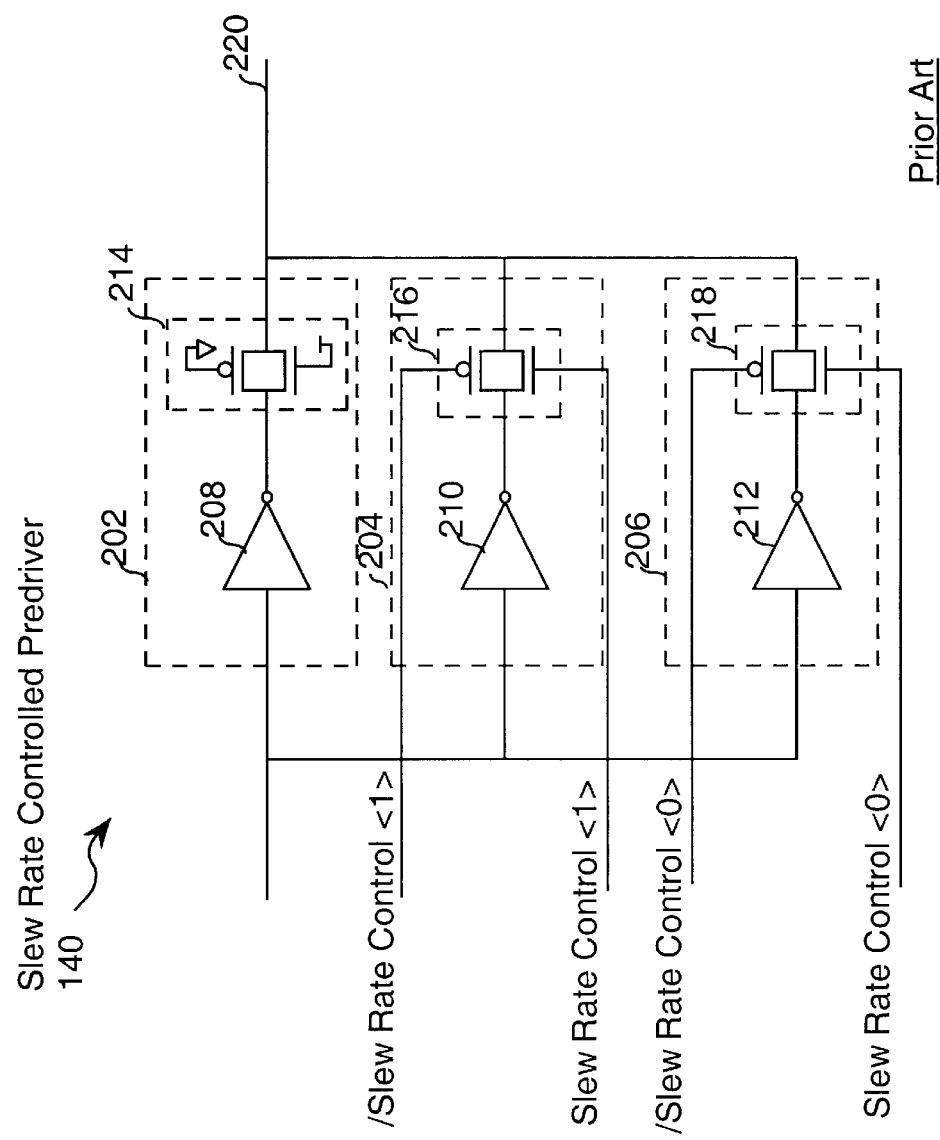
FIG. 7 is a circuit diagram of an exemplary slew rate controlled predriver of FIGS. 5 and 6.

FIG. 7 is a circuit diagram of an exemplary slew rate controlled pre-driver 140 used with the present invention. The SRC predriver 140 has a plurality of predriver sub-blocks 202, 204, 206. The number of predriver sub-blocks may be more or less than the three shown in FIG. 7, depending on the amount of slew rate control required. Generally, there will be one more predriver sub-block than there are Slew Rate Control bits.

Each predriver sub-block 202, 204, 206 has an inverter 208, 210, 212 and a passgate pair 214, 216, 218 respectively. One predriver sub-block 202 is always enabled with the gate of each transistor of the passgate pair 214 connected to the supply voltage Vcc and to ground, respectively. The other passgate pairs 216, 218 of the predriver sub-blocks 204, 206 connect to the slew rate control bits, Slew Rate Control <0> and Slew Rate Control <1>. The slew rate of the predriver 140 is adjusted by enabling and disabling the passgates 216, 218 with slew rate control signals on the slew rate control bits.

In particular, when the slew rate control signal on Slew Rate Control bit <1> is high, the passgate pair 216 of the predriver sub-block 204 is enabled. The passgate pair 216 increases the rate of transition between a high voltage level and a low voltage level of an intermediate signal on node 220. When the slew rate control bit <1> is low, the corresponding passgate pair 216 of the predriver sub-block 204 is effectively disabled and the slew rate is unaffected. Enabling the additional passgate pairs of additional predriver sub-blocks 206 further increases the slew rate of the q-node signal.

Figure 8:
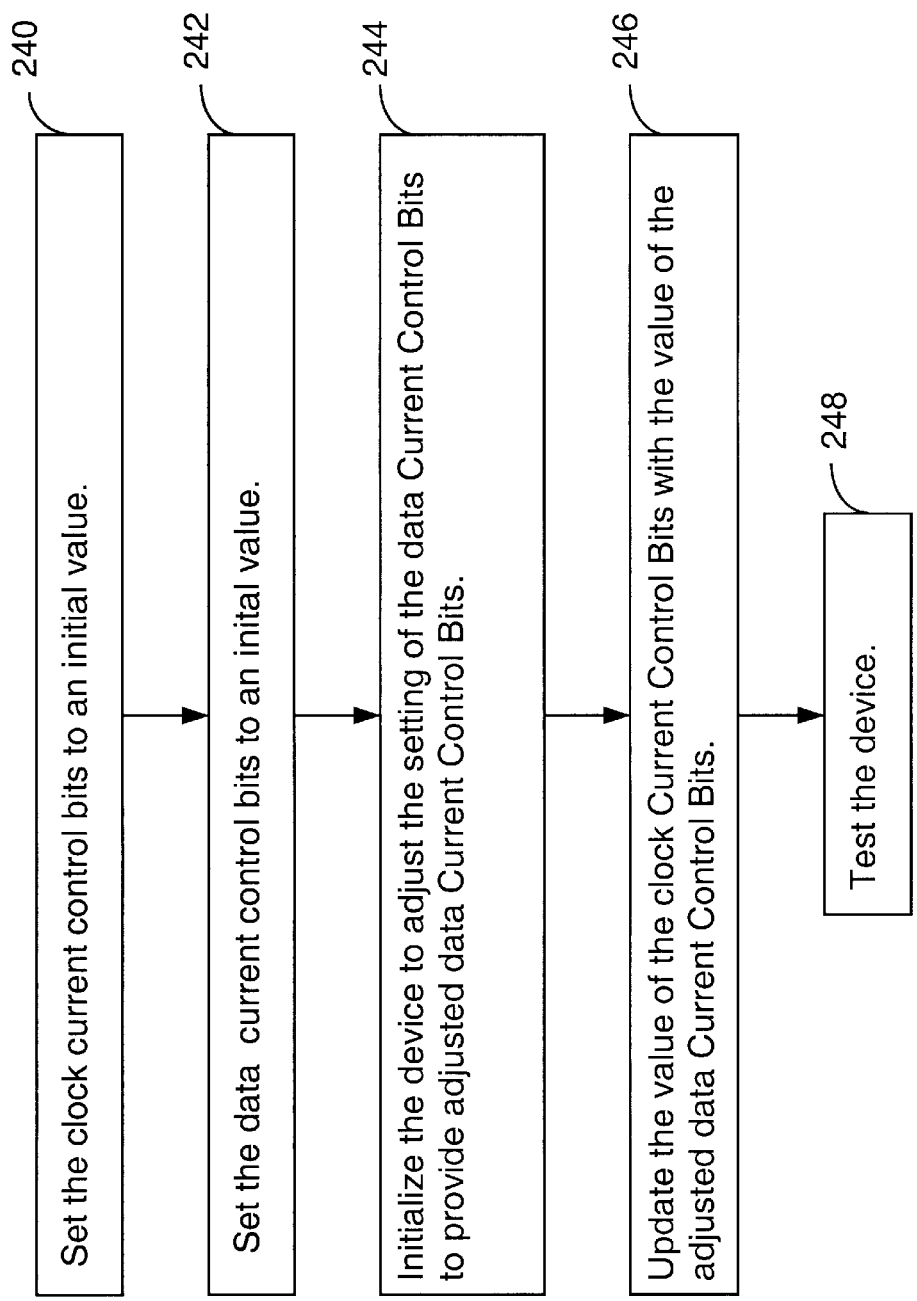
FIG. 8 is a flowchart of a method of setting clock current control bits of a clock current control register of FIG. 3.

FIG. 8 is a flowchart of a method of setting clock current control bits of a clock current control register of FIG. 5. In step 240, the logic circuit 88 (FIG. 3) sets the clock current control bits of the clock current control register 84 (FIG. 3) to a predetermined initial value that guarantees the generation of a clock signal. In step 242, the logic circuit 88 (FIG. 3) sets the data current control bits of the data current control register 82 (FIG. 3) to another predetermined initial value. In step 244, the logic circuit 88 (FIG. 3) adjusts the setting of the data current control bits to provide adjusted data current control bits so that a specified rail-to-rail voltage swing on the bus is maintained. In step 246, the logic circuit 88 (FIG. 3) updates the clock current control bits of the clock current control register 84 (FIG. 3) to the same value as the adjusted data current control bits. In step 248, after setting the clock current control bits, device testing continues.

U.S. Pat. No. 5,254,883, to Horowitz et al. is hereby incorporated by reference in its entirety as background information on a method of setting the data current control bits. U.S. patent application Ser. No. 09/222,590 to Stark et al. is hereby incorporated by reference in its entirety as background information of an alternate embodiment of an output driver and a method of setting the data current control bits.

During testing, the slew rate control bits are simultaneously adjusted for both the output drivers and the test clock generator 100. While calibrating the current control bits, the voltage level of the output data signal changes. To set data current control bits to a desired operating value, a stable internal clock is supplied to the DLL 94 (FIG. 3) so that the 90° clock signal is guaranteed to be supplied to the output drivers. If the clock current control bits were to be changed while calibrating the data current control bits, the internal clock signal and therefore the 90° clock signal may disappear and testing would fail. Therefore, the current control bits for the internal clock generator 100 are stored in a separate register, the clock current control register 84 (FIG. 3), from the data current control register 82 (FIG. 2) that stores the data current control bits.

The predetermined initial value of the clock and data current control bits depends on the process used to manufacture the device and the specification of the bus. Although the predetermined initial value of the clock current control bits may not be the final value, the predetermined initial value is sufficient to ensure that the 90° clock signal will be generated.

Although the invention was described with respect to a memory controller, in another embodiment, the bus interface of the present invention provides a high-speed device-to-device interface. In an alternate embodiment, the bus interface is used in the memory devices 24 (FIG. 1). When using the test-clock generator 100 (FIG. 4) in a memory device 24, the CTM and CFM pins, and the /CTM and /CFM pins, are not shorted together. Rather, the memory devices uses two pairs of differential clock signals to control their operation. The test-clock generator 100 for memory devices 24 therefore generates two pairs of differential clock signals, instead of just one pair of differential clock signals as described above for the test-clock generator for the memory controller device 22. All four external clock pins for the device are connected to termination resistors 112–118 during the test mode of operation.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A clock signal driven device, comprising:
a first clock pin for receiving a first externally generated clock signal during a normal mode of operation; the first externally generated clock signal having predefined signal characteristics;
internal circuitry coupled to the first clock pin and responsive to the externally generated clock signal during said normal mode of operation;
a clock source on the device providing a first internal clock signal; and
an internal clock generator coupled to the first clock pin and to the clock source, the internal clock generator configured during a test mode of operation to generate from the first internal clock signal and to assert on the first clock pin a first test clock signal, the first test clock signal having substantially similar signal characteristics to the predefined signal characteristics of the first externally generated clock signal;
wherein the internal circuitry is responsive to the first test clock signal during said test mode of operation.

2. The device of claim 1 wherein the predefined signal characteristics comprise a low voltage of the first externally generated clock signal.

3. The device of claim 1 wherein the predefined signal characteristics comprise a low voltage level, slew rate and frequency.

4. The device of claim 1 further comprising:
a data output driver having a data drive transistor,
wherein the internal clock generator includes a clock output driver having at least two clock drive transistors, two of the clock drive transistors each being substantially the same as the data drive transistor, the clock drive transistors providing the first test clock signal.

5. The device of claim 1 further comprising:
a clock current control register having clock current control bits, wherein the internal clock generator is responsive to the clock current control bits to set a drive current of the first test clock signal.

6. The device of claim 5 further comprising:
a slew rate control register having slew rate control bits;
wherein the internal clock generator includes:
a current control circuit, responsive to a distinct one of the current control bits, and outputting a first predetermined data value and the complement of the first predetermined data value when the respective current control bit is enabled;
a passgate circuit that, in response to the second internal clock signal, supplies an internal data signal alternately in accordance with the first predetermined data value and the complement of the first predetermined data value;
a predriver, responsive to the slew rate control bits and the internal data signal to provide an adjusted data signal having a slew rate determined by the slew rate control bits; and
an output driver, responsive to the adjusted data signal, that provides at least a portion of the first test clock signal.

7. The device of claim 1 wherein
the internal clock generator includes a plurality of clock output drivers, each clock output driver having at least one clock output transistor;
the internal circuitry includes:
a set of data output drivers, each data output driver having a data output transistor; and
a data current control register having data current control bits, each data current control bit enabling a respective data output driver of the set of data output drivers; and
the device further comprises a clock current control register having clock current control bits, each clock current control bit enabling a respective clock output driver of the plurality of clock output drivers;
wherein the data output transistor of at least one data output driver and the clock output transistor of at least one clock output driver are substantially the same.

8. The device of claim 1 further comprising:
a slew rate control register having slew rate control bits, wherein the internal clock generator is responsive to the slew rate control bits to set a slew rate of the first test clock signal.

9. The device of claim 1 wherein the predefined signal characteristics comprise a low voltage level associated with the first externally generated clock signal;
and further comprising a bus interface having:
a plurality of receivers to receive input data signals from data pins, at least a subset of the input data signals having signal characteristics that include a common low voltage level substantially equal to the low voltage level associated with the first externally generated clock signal; and a plurality of data output drivers to transmit output data signals to the data pins, at least another subset of the output data signals having signal characteristics that include the common low voltage level.

10. A clock signal driven device, comprising:

first and second clock pins for receiving first and second externally generated clock signals during a normal mode of operation; the first and second externally generated clock signals having predefined signal characteristics;

internal circuitry coupled to the first and second clock pins and responsive to the first and second externally generated clock signals during said normal mode of operation for sending and receiving data signals to and from a bus external to the device;

a clock source on the device providing a first internal clock signal; and an internal clock generator coupled to the first and second clock pins and to the clock source, the internal clock generator configured during a test mode of operation to generate from the first internal clock signal and to assert on the first and second clock pins first and second test clock signals, respectively, the first and second test clock signals having substantially similar signal characteristics to the predefined signal characteristics of the first and second externally generated clock signals;

wherein the internal circuitry is responsive to the first and second test clock signals during said test mode of operation.

11. The device of claim 10 wherein the predefined signal characteristics comprise high and low voltages of the first and second externally generated clock signals.

12. The device of claim 10 wherein the predefined signal characteristics comprise a low voltage level, slew rate and frequency.

13. The device of claim 10 further comprising a data output driver having a data drive transistor;

wherein the internal clock generator includes a clock output driver having at least two clock drive transistors, two of the clock drive transistors each being substantially the same as the data drive transistor, the clock drive transistors providing the first test clock signal.

14. The device of claim 10 further comprising:

a clock current control register having clock current control bits, wherein the internal clock generator is responsive to the clock current control bits to set drive currents of the first and second test clock signals.

15. The device of claim 14 further comprising:

a slew rate control register having slew rate control bits;

wherein the internal clock generator includes a plurality of clock output drivers, each output clock driver having:

a current control circuit, responsive to a distinct one of the current control bits, and outputting a first predetermined data value and the complement of the first predetermined data value when the respective current control bit is enabled;

a passgate circuit that, in response to the second internal clock signal, supplies an internal data signal alternately in accordance with the first predetermined data value and the complement of the first predetermined data value;

a predriver, responsive to the slew rate control bits and the internal data signal to provide an adjusted data signal having a slew rate determined by the slew rate control bits; and an output driver, responsive to the adjusted data signal, that provides at least a portion of a respective one of the first and second test clock signals.

16. The device of claim 10 wherein the internal clock generator includes a plurality of clock output drivers, each clock output driver having at least one clock output transistor;

the internal circuitry includes:

a set of data output drivers, each data output driver having a data output transistor; and a data current control register having data current control bits, each data current control bit enabling a respective data output driver of the set of data output drivers; and the device further comprises a clock current control register having clock current control bits, each clock current control bit enabling a respective clock output driver of the plurality of clock output drivers;

wherein the data output transistor of at least one data output driver and the clock output transistor of at least one clock output driver are substantially the same.

17. The device of claim 10 further comprising:

a slew rate control register having slew rate control bits, wherein the internal clock generator is responsive to the slew rate control bits to set a slew rate of the first and second test clock signals.

18. The device of claim 10 wherein the predefined signal characteristics comprise a low voltage level associated with the first externally generated clock signal;

and further comprising a bus interface having:

a plurality of receivers to receive input data signals from data pins, at least a subset of the input data signals having signal characteristics that include a common low voltage level substantially equal to the low voltage level associated with the first externally generated clock signal; and a plurality of data output drivers to transmit output data signals to the data pins, at least another subset of the output data signals having signal characteristics that include the common low voltage level.

19. A method of generating an internal clock for testing a bus interface in a device, comprising:

setting clock current control bits to a first predetermined value such that an internal clock signal is generated;

setting data current control bits to a second predetermined value;

adjusting the data current control bits to an adjusted value using the internal clock signal to provide an adjusted data output signal when transmitting data; and setting the clock current control bits to the adjusted value.

20. The method of claim 19 further comprising:

determining values of slew rate control bits to adjust a slew rate of the adjusted data output signal and a corresponding slew rate of the internal clock signal.

21. A method of testing a clock signal driven device, comprising:

during a test mode of operation:

generating a first internal clock signal;

using an internal clock generator, generating from the first internal clock signal and asserting on a first clock pin a first test clock signal;

operating internal circuitry of the device responsive to the first test clock signal; and during a normal mode of operation:
receiving on the first clock pin a first externally generated clock signal during a normal mode of operation; the first externally generated clock signal having predefined signal characteristics; and
operating the internal circuitry of the device responsive to the first externally generated clock signal;
wherein the first test clock signal has substantially similar signal characteristics to the predefined signal characteristics of the first externally generated clock signal.

22. The method of claim 21 wherein the predefined signal characteristics comprise high and low voltages of the first externally generated clock signal.

23. The method of claim 21 wherein the predefined signal characteristics comprise a low voltage level, slew rate and frequency.

24. The method of claim 21 further comprising storing in a slew rate control register a set of slew rate control bits;
wherein said first test clock signal generating step includes setting a slew rate of the first test clock signal in accordance with the set of slew rate control bits stored in the slew rate control register.

25. The method of claim 21 wherein the predefined signal characteristics comprise a low voltage level associated with the first externally generated clock signal;
the method further comprising:
receiving input data signals from data pins, at least a subset of the input data signals having signal characteristics that include a common low voltage level substantially equal to the low voltage level associated with the first externally generated clock signal; and
transmitting output data signals to the data pins, at least another subset of the output data signals having signal characteristics that include the common low voltage level.

26. A clock signal driven device, comprising:
a first clock pin adapted to receive a first externally generated clock signal during a normal mode of operation;
internal circuitry coupled to the first clock pin and configured to be responsive to the externally generated clock signal during said normal mode of operation;
a clock source on the device configured to provide a first internal clock signal; and
an internal clock generator coupled to the first clock pin and to the clock source, the internal clock generator configured to, during a test mode of operation, generate a first clock signal from the first internal clock signal and to assert the first test clok signal on the first clock pin;
wherein the internal circuitry is configured to be reponsive to the first test clock signal during said test mode of operation.

27. The device of claim 26 further comprising:
a data output driver a data drive transistor,
wherein the internal clock generator includes a clock output driver having at least two clock drive transistors, two of the clock drive transistors each being substantially the same as the data drive transistor, the clock drive transistors configured to provide the first test clock signal.

28. The device of claim 1 further comprising:
a clock current control register configured to store clock current control bits, wherein the internal clock generator is configured to be responsive to the clock current control bits to set a drive current of the first test clock signal.

29. A clock signal driven device, comprising:
first and second clock pins adapted to receive first and second externally generated clock signal during a normal mode of operation;
internal circuitry coupled to the first and second clock pins and configured to be responsive to the first and second externally generated clock signals during said normal mode of operation, said internal circuitry adapted to send and receive data signals to and from a bus external to the device;
a clock source on the device configured to provide a first internal clock signal; and
an internal clock generator coupled to the first and second clock pins and to the clock soruce, the internal clock generator configured to, during a test mode of operation, generate first and second test clock signals from the first internal clock signal and to assert the first and second test clock signals on the first and second clock pins, respectively;
wherein the internal circuitry is configured to be responsive to the first and second test clock signals during said test mode of operation.

30. The device of claim 30 further comprising a data output driver having a data drive transistor;
wherein the internal clock generator includes a clock output driver having at least two clock drive transistors, two of the clock drive transistors each being substantially the same as the data drive transistor, the clock drive transistors configured to provide the first test clock signal.

31. The device of claim 30 further comprising:
a clock current control register configured to store clock current control bits, wherein the internal clock generator is configured to be responsive to the clock current control bits to set drive currents of the first and second test clock signals.

32. A method of testing a clock signal driven device, comprising:
during a test mode of operation:
generating a first internal clock signal;
using an internal clock generator, generating from the first internal clock signal and asserting on a first clock pin a first test clock signal;
operating internal circuitry of the device responsive to the first test clock signal; and
during a normal of operation:
receiving on the first clock pin a first externally generated clock signal; and
operating the internal circuitry of the device responsive to the first externally generated clock signal.

33. The method of claim 32 further comprising storing in a slew rate control register a set of slew rate control bits; and
wherein said first test clock signal generating step includes setting a slew rate of the first test clock signal in accordance with the set of slew rate control bits stored in the slew rate control register.

* * * * *

UNITED STATES PATENT AND TRADEMARK OFFICE
CERTIFICATE OF CORRECTION

PATENT NO. : 6,760,857 B1
DATED : July 6, 2004
INVENTOR(S) : Lau et al.

It is certified that error appears in the above-identified patent and that said Letters Patent is hereby corrected as shown below:

Column 11,
Line 45, cancel the text beginning with "1. A clock signal driven" to and ending "test mode of operation"
Line 64, insert the following claim:

-- 1. A clock signal driven device, comprising:
  a first clock pin adapted to receive a first externally generated clock signal during a normal mode of operation, the first externally generated clock signal having predefined signal characteristics;
  internal circuitry coupled to the first clock pin and configured to be responsive to the externally generated clock signal during said normal mode of operation;
  a clock source on the device configured to provide a first internal clock signal; and
  an internal clock generator coupled to the first clock pin and to the clock source, the internal clock generator configured to, during a test mode of operation, generate a first test clock signal from the first internal clock signal and to assert the first test clock signal on the first clock pin, wherein the first test clock signal has substantially similar signal characteristics to the predefined signal characteristics of the first externally generated clock signal;
  wherein the internal circuitry is configured to be responsive to the first test clock signal during said test mode of operation. --

Column 12,
Line 10, delete "providing" and insert -- configured to provide --.
Line 11, cancel the text beginning with "5. The device of claim 1" to and ending "first test clock signal."
Line 15, insert the following claim:

-- 5. The device of claim 1 further comprising:
  a clock current control register configured to store clock current control bits, wherein the internal clock generator is configured to be responsive to the clock current control bits to set a drive current of the first test clock signal. --

Line 16, cancel the text beginning with "6. The device of claim 5" to and ending "first test clock signal."
Lines 35 and 36, insert the following claim:

-- 6. The device of claim 5 further comprising:
  a slew rate control register configured to store slew rate control bits;

UNITED STATES PATENT AND TRADEMARK OFFICE
CERTIFICATE OF CORRECTION

PATENT NO. : 6,760,857 B1
DATED : July 6, 2004
INVENTOR(S) : Lau et al.

It is certified that error appears in the above-identified patent and that said Letters Patent is hereby corrected as shown below:

Column 12, cont., wherein the internal clock generator includes:
    a current control circuit configured to be responsive to a distinct one of the current control bits and to output a first predetermined data value and the complement of the first predetermined data value when the respective current control bit is enabled;
    a passgate circuit configured to supply, in response to the second internal clock signal, an internal data signal alternately in accordance with the first predetermined data value and the complement of the first predetermined data value;
    a predriver configured to be responsive to the slew rate control bits and the internal data signal and to provide an adjusted data signal having a slew rate determined by the slew rate control bits; and
    an output driver configured to be responsive to the adjusted data signal and to provide at least a portion of the first test clock signal. --

Line 37, cancel the text beginning with "7. The device of claim 1" to and ending "are substantially the same"
Line 55, insert the following claim:

-- 7.    The device of claim 1 wherein
    the internal clock generator includes a plurality of clock output drivers, each clock output driver having at least one clock output transistor;
    the internal circuitry includes:
        a set of data output drivers, each data output driver having a data output transistor; and
        a data current control register configured to store data current control bits, wherein each of the data output drivers of the set of data output drivers is adapted to be enabled by one of the data current control bits; and
    the device further comprises a clock current control register configured to store clock current control bits, wherein each of the clock output drivers of the plurality of clock output drivers is configured to be enabled by one of the clock current control bits;
    wherein the data output transistor of at least one data output driver and the clock output transistor of at least one clock output driver are substantially the same. --

Line 57, delete "having" and insert -- configured to store --
Line 58, between the words "is" and "responsive" insert -- configured to be --
Line 64, between the words "and" and "further" insert -- the device --

UNITED STATES PATENT AND TRADEMARK OFFICE
CERTIFICATE OF CORRECTION

PATENT NO. : 6,760,857 B1
DATED : July 6, 2004
INVENTOR(S) : Lau et al.

It is certified that error appears in the above-identified patent and that said Letters Patent is hereby corrected as shown below:

Column 13,
Line 5, delete the word "another" and insert -- a --
Line 8, cancel the text beginning with "10. A clock signal" to and ending "test mode of operation."
Lines 31-32, insert the following claim:

-- 10. A clock signal driven device, comprising:
 first and second clock pins adapted to receive first and second externally generated clock signals during a normal mode of operation, the first and second externally generated clock signals having predefined signal characteristics;
 internal circuitry coupled to the first and second clock pins and configured to be responsive to the first and second externally generated clock signals during said normal mode of operation, said internal circuitry adapted to send and receive data signals to and from a bus external to the device;
 a clock source on the device configured to provide a first internal clock signal; and
 an internal clock generator coupled to the first and second clock pins and to the clock source, the internal clock generator configured to, during a test mode of operation, generate first and second test clock signals from the first internal clock signal and to assert the first and second test clock signals on the first and second clock pins, respectively, wherein the first and second test clock signals have substantially similar signal characteristics to the predefined signal characteristics of the first and second externally generated clock signals;
 wherein the internal circuitry is configured to be responsive to the first and second test clock signals during said test mode of operation.

Line 45, please delete "providing" and insert -- configured to provide --
Line 47, please delete "having" and insert -- configured to store --
Lines 48-49, between the words "is" and "responsive" please insert -- configured to be --
Line 51, cancel the text beginning with "15. The device of claim 14" to and ending "second test clock signals."

Column 14,
Line 5, insert the following claim:

-- 15. The device of claim 14 further comprising:
 a slew rate control register configured to store slew rate control bits;

UNITED STATES PATENT AND TRADEMARK OFFICE
CERTIFICATE OF CORRECTION

PATENT NO. : 6,760,857 B1
DATED : July 6, 2004
INVENTOR(S) : Lau et al.

It is certified that error appears in the above-identified patent and that said Letters Patent is hereby corrected as shown below:

Column 14, Line 5 cont., wherein the internal clock generator includes a plurality of clock output drivers, each output clock driver having:
a current control circuit configured to be responsive to a distinct one of the current control bits, and to output a first predetermined data value and the complement of the first predetermined data value when the respective current control bit is enabled;
a passgate circuit that is configured to supply, in response to the second internal clock signal, an internal data signal alternately in accordance with the first predetermined data value and the complement of the first predetermined data value;
a predriver configured to be responsive to the slew rate control bits and the internal data signal to provide an adjusted data signal having a slew rate determined by the slew rate control bits; and
an output driver configured to be responsive to the adjusted data signal and to provide at least a portion of a respective one of the first and second test clock signals. --

Line 6, cancel the text beginning with "16. The device of claim 10" to and ending "are substantially the same."
Lines 23-24, insert the following claim:

-- 16. The device of claim 10 wherein
the internal clock genereator includes a plurality of clock output drivers, each clock output driver having at least one clock output transistor;
the internal circuitry includes:
a set of data output drivers, each data output driver having a data output transistor; and
the device further comprises a clock current control register configured to store clock current control bits, each clock current control bit configured to enable a respective clock output driver of the plurality of clock output drivers;
wherein the data output transistor of at least one data output driver and the clock output transistor of at least one clock output driver are substantially the same. --

Line 26, please delete "having" and insert -- configured to store --
Line 27, between the words "is" and "responsive" insert -- configured to be --
Line 30, cancel the text beginning with "18. The device of claim 10" to and ending "common low voltage level."

UNITED STATES PATENT AND TRADEMARK OFFICE
CERTIFICATE OF CORRECTION

PATENT NO. : 6,760,857 B1
DATED : July 6, 2004
INVENTOR(S) : Lau et al.

It is certified that error appears in the above-identified patent and that said Letters Patent is hereby corrected as shown below:

Column 14 cont.,
Line 43, insert the following claim:

-- 18. The device of claim 10 wherein the predefined signal characteristics comprise a low voltage level associated with the first externally generated clock signal;
 and further comprising a bus interface having:
 a plurality of receivers configured to receive input data signals from data pins, at least a subset of the input data signals having signal characteristics that include a common low voltage level substantially equal to the low voltage level associated with the first externally generated clock signal; and
 a plurality of data output drivers configured to transmit output data signals to the data pins, at least a subset of the output data signals having signal characteristics that include the common low voltage level. --

Column 15,
Lines 3-4, delete "during a normal mode of operation".

Column 16,
Line 6, delete "signal" and insert -- signals --.
Line 18, delete "soruce" and insert -- source --.

Signed and Sealed this

Twenty-first Day of September, 2004

JON W. DUDAS
*Director of the United States Patent and Trademark Office*